United States Patent
Kim et al.

(10) Patent No.: US 8,937,342 B1
(45) Date of Patent: Jan. 20, 2015

(54) CMOS IMAGE SENSOR HAVING OPTICAL BLOCK AREA

(71) Applicants: SK Hynix Inc., Gyeonggi-do (KR); Postech Academy-Industry Foundation, Gyeongsangbuk-do (KR)

(72) Inventors: Do Hwan Kim, Gyeonggi-do (KR); Su Hwan Lim, Gyeonggi-do (KR); Hae Wook Han, Gyeonggi-do (KR); Young Woong Do, Gyeonggi-do (KR); Won Jun Lee, Gyeonggi-do (KR)

(73) Assignees: SK Hynix Inc., Gyeonggi-do (KR); Postech Academy-Industry Foundation, Gyeongsangbuk-do (KR)

( * ) Notice: Subject to any disclaimer, the term of this patent is extended or adjusted under 35 U.S.C. 154(b) by 0 days.

(21) Appl. No.: 14/041,744

(22) Filed: Sep. 30, 2013

(30) Foreign Application Priority Data

Jul. 18, 2013 (KR) .................. 10-2013-0084455

(51) Int. Cl.
*H01L 27/148* (2006.01)
*H01L 27/14* (2006.01)
*H01L 31/0232* (2014.01)
*H01L 27/146* (2006.01)
*H01L 31/02* (2006.01)
*H01L 21/00* (2006.01)

(52) U.S. Cl.
CPC .... *H01L 27/14625* (2013.01); *H01L 27/14643* (2013.01)
USPC ........... 257/233; 257/431; 257/432; 257/444; 257/184; 257/82; 438/70

(58) Field of Classification Search
USPC ........... 257/40, 82, 84–85, 99, 103, 184, 190, 257/233, 431, 432, 443–448, 482, 483, 257/797; 438/70; 250/208.1, 208.2, 214.1, 250/226, 214 R, 214 SG, 216, 338.1, 353, 250/339.01, 339.02, 339.07
See application file for complete search history.

(56) References Cited

U.S. PATENT DOCUMENTS

| | | | |
|---|---|---|---|
| 6,297,540 B1* | 10/2001 | Assadi et al. | 257/432 |
| 6,300,612 B1* | 10/2001 | Yu | 250/208.1 |
| 6,303,943 B1* | 10/2001 | Yu et al. | 257/40 |
| 6,483,099 B1* | 11/2002 | Yu et al. | 250/214.1 |
| 6,639,292 B2* | 10/2003 | Yagi | 257/440 |
| 6,891,869 B2* | 5/2005 | Augusto | 372/43.01 |
| 7,336,023 B2* | 2/2008 | Youh et al. | 313/112 |
| 8,633,440 B2* | 1/2014 | Knapp | 250/338.1 |
| 2002/0003201 A1* | 1/2002 | Yu | 250/208.1 |
| 2004/0056180 A1* | 3/2004 | Yu | 250/214.1 |
| 2013/0300850 A1* | 11/2013 | Millikan | 348/77 |

FOREIGN PATENT DOCUMENTS

| | | |
|---|---|---|
| KR | 100881200 | 2/2009 |
| KR | 1020110049303 | 5/2011 |

* cited by examiner

*Primary Examiner* — Evan Pert
*Assistant Examiner* — Gustavo Ramallo
(74) *Attorney, Agent, or Firm* — IP & T Group LLP

(57) ABSTRACT

A CMOS image sensor includes an active pixel structure suitable for sensing light incident from outside and converting a sensed light into an electrical signal, and an optical block structure suitable for blocking a visible light and passing a UV light to check and evaluate an electrical characteristic of the active pixel area. The UV pass filter includes first and second insulation layers comprising an insulator, and a metal layer formed between the first and second insulation layers.

16 Claims, 7 Drawing Sheets

CMOS IMAGE SENSOR HAVING OPTICAL BLOCK AREA

CROSS-REFERENCE TO RELATED APPLICATIONS

The present application claims priority of Korean Patent Application No. 10-2013-0084455, filed on Jul. 18, 2013, which is incorporated herein by reference in its entirety.

BACKGROUND OF THE INVENTION

1. Field of the Invention

The embodiments of the present invention relate to an image sensor, and more particularly, to a CMOS image sensor having an optical block area set in a pixel array.

2. Description of the Related Art

With the development of electronic communication, digital devices having a digital processing function, such as digital cameras, mobile phones, game machines, and micro cameras, have been rapidly spread. Most of the digital devices include an image sensor required for taking an image.

The image sensor senses an image. Specifically, the image sensor converts an image inputted as light from outside into an electrical signal and transmits the electrical signal to a digital processing device. Examples of the image sensor may include a charge coupled device (CCD) image sensor and a complementary metal oxide semiconductor (CMOS) image sensor.

The CCD image sensor includes a photodiode, a CCD, and a signal detection circuit, which are formed over a P-type impurity layer. The photodiode serves to convert light incident from outside into an electric charge, the CCD serves to transmit the electric charge to the signal detection circuit, and the signal detection circuit serves to convert the electric charge into a voltage.

The CMOS image sensor includes CMOS transistors each configured in a complementary manner to join a PMOS (P channel Metal Oxide Semiconductor) transistor and an NMOS (N channel Metal Oxide Semiconductor) transistor, in order to convert an input image into an electrical signal. The CMOS image sensor has an advantage in which it has high integration degree and low power consumption.

The image sensor includes a light sensing unit configured to receive light incident from outside and generate and store photo-charges. The image sensor further includes a color filter disposed over the light sensing unit. The color filter may have three colors of red, green, and blue or three colors of yellow, magenta, and cyan.

In particular, the CMOS image sensor includes an optical block area for blocking light from being irradiated onto pixels. The pixels formed in the optical block area are optional pixels for black level correction, and are used for controlling a pixel output. Since the optical block area uses a pixel output as an offset value in a dark state, the optical block area is generally implemented in a state in which the introduction of light is blocked. As such, the pixels in the optical block area determine the offset value in place of main pixels. Thus, when an asymmetry occurs between the main pixels and the pixels in the optical block area, the noise characteristic of the image sensor may be seriously degraded.

Furthermore, the pixels in the optical block area receive plasma damage after a back-end process, or particularly, after an etching process. In order to cure the plasma damage, UV erase, that is, UV anneal may be performed. At this time, the pixels in the optical block area have a UV curing effect different from the main pixels, because UV light is blocked during the curing process. Thus, the dark current characteristic of the pixels in the optical block area may differ, and a serious asymmetry may occur between the pixels. As a result, the noise characteristic of the CMOS image sensor may be degraded.

SUMMARY OF THE INVENTION

Accordingly, the embodiments of the present invention has been made in an effort to resolve the concerns occurring in the related art, and an object of the embodiment of the present invention is to provide a CMOS image sensor including a filter capable of equalizing a UV curing effect applied to pixels formed in an optical block area to a UV curing effect applied to main pixels formed in an active pixel area.

According to an embodiment of the present invention, a CMOS image sensor may include an active pixel structure suitable for sensing light incident from outside and converting a sensed light into an electrical signal, and an optical block structure suitable for blocking a visible light and passing a UV light to check and evaluate an electrical characteristic of the active pixel area. The UV pass filter may include first and second insulation layers comprising an insulator, and a metal layer formed between the first and second insulation layers.

According to another embodiment of the present invention, a CMOS image sensor may include an active pixel structure suitable for sensing light incident from outside and converting a sensed light into an electrical signal, and an optical block structure suitable for blocking a visible light and passing a UV light to check and evaluate an electrical characteristic of the active pixel area. The UV pass filter may include a plurality of insulation layers comprising an insulator, respectively, and a plurality of metal layers formed between the first and second insulation layers, respectively.

BRIEF DESCRIPTION OF THE DRAWINGS

The above objects, and other features and advantages of the present invention will become more apparent after a reading of the following detailed description taken in conjunction with the drawings, in which:

FIG. 38 is a side cross-sectional view illustrating an embodiment of the optical block area illustrated in FIG. 2;

FIG. 58 is another plan view illustrating the embodiment of the metal layer illustrated in FIG. 3A;

DETAILED DESCRIPTION

Figure 1:
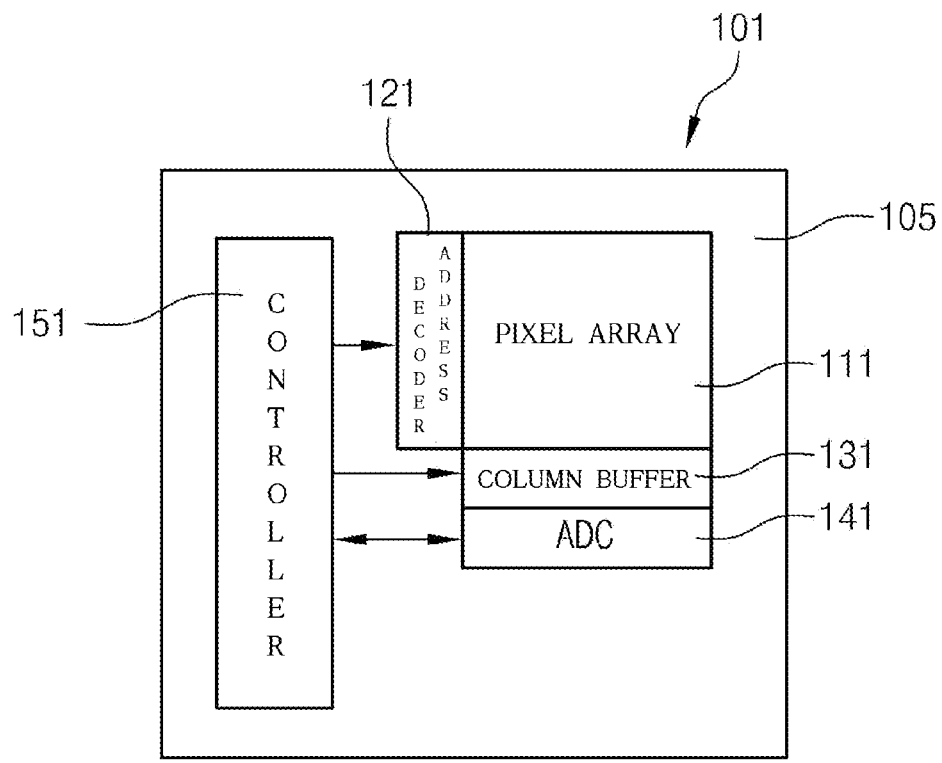
FIG. 1 is a block diagram illustrating a CMOS image sensor in accordance with an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram of a CMOS image sensor in accordance with an embodiment of the present invention. Referring to FIG. 1, the CMOS image sensor 101 includes a pixel array 111, an address decoder 121, a column buffer 131, an analog digital converter (ADC) 141, and a controller 151 that are formed on a semiconductor substrate 105.

The pixel array 111 includes a plurality of light sensing elements, that is, a plurality of pixels. The light sensing element may be implemented with a photo transistor, a photo diode, a photo gate, a pinned photo diode, or the like. The light sensing elements may be arranged in a matrix shape. The structure of the pixel array will be described in detail with reference to FIG. 2.

The address decoder 121 is configured to decode an address signal received from the controller 151 and designate a corresponding light sensing element among the light sensing elements included in the pixel array 111.

The column buffer 131 is configured to buffer and output signals outputted by the column from the pixel array 111 according to the control of a signal outputted from the controller 151.

The ADC 141 is configured to receive the signals outputted from the column buffer 131, convert the received signals into digital signals, and transmit the digital signals to the controller 151.

The controller 151 is configured to receive a signal inputted from outside and control the address decoder 121, the column buffer 131, and the ADC 141. Furthermore, the controller 151 is configured to receive a digital signal outputted from the ADC 141 and transmit the received signal to an external device, such as a display to store or display an image.

Figure 2:
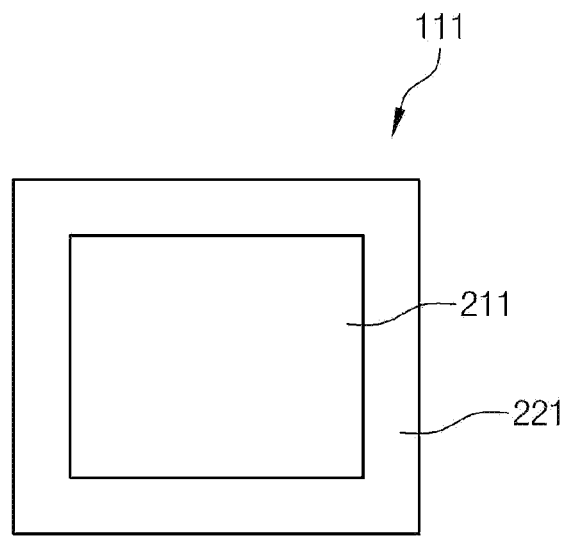
FIG. 2 is a plan view illustrating a pixel array of FIG. 1.

FIG. 2 is a plan view of the pixel array 111 of FIG. 1. Referring to FIG. 2, the pixel array 111 is divided into an active pixel area 211 and an optical block area 221.

The active pixel area 211 is configured to sense light incident from outside, convert the sensed light into an electrical signal, and output the electrical signal to the column buffer 131. The active pixel area 211 includes a plurality of main light sensing elements, that is, main pixels arranged in a matrix shape.

The optical block area 221 is arranged to surround the active pixel area 211. The optical block area 221 is configured to block light incident from outside and check and evaluate an electrical characteristic of the active pixel area 211, that is, a dark noise characteristic based on dark current. In other words, the optical block area 221 may check and evaluate the dark noise characteristic based on a dark current. Based on the evaluation result, the optical block area 221 compensates for a current value corresponding to the dark current of the main pixels in the active pixel area 211, thereby preventing dark noise from occurring in the image sensor. The horizontal and vertical sizes of the optical block area 221 may be arbitrarily set according to process parameters.

Figure 3A:
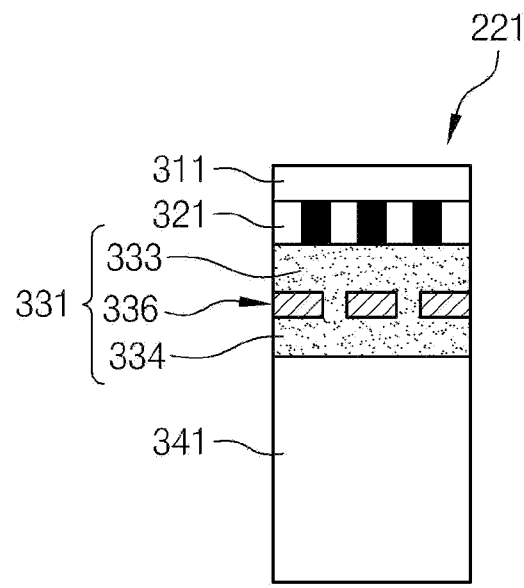
FIG. 3A is a side cross-sectional view illustrating an embodiment of an optical block area illustrated in FIG. 2.

FIG. 3A is a side cross-sectional view of an embodiment of the optical block area 221 illustrated in FIG. 2. Referring to FIG. 3A, the optical block area 221 includes a micro-lens 311, a color filter 321, a UV pass filter 331, and a pixel layer 341. The micro-lens 311, the color filter 321, and the UV pass filter 331 are sequentially stacked over the pixel layer 341.

The micro-lens 311 may condense light incident from outside. The color filter 321 may include a filter that passes visible light from the light incident through the micro-lens 311. The color filter 321 may be implemented with any one of a red filter that passes only red light in the visible light, a green filter that passes only green light in the visible light, and a blue filter that passes only blue light in the visible light. If necessary, the color filter 321 may include any one of a cyan filter, a yellow filter, and a magenta filter.

The micro-lens 311 and the color filter 321 may not be provided in the optical block area 221, depending on cases.

The UV pass filter 331 may block visible light from the light, which is incident on the optical block area 221 from outside and passes through the color filter 321, and may pass only UV light. The UV pass filter 331 includes first and second insulation layers 333 and 334.

The first and second insulation layers 333 and 334 are formed over the pixel layer 341. The first and second insulation layers 333 and 334 may protect optical black pixels formed over the pixel layer 341 from the external environment. That is, the first and second insulation layers 333 and 334 may prevent the optical black pixels from being damaged by an external impact or physical force. Each of the first and second insulation layers 333 and 334 may include an oxide layer including oxide ($SiO_2$), a nitride layer including nitride, or a composite layer including oxide and nitride.

A metal layer 336 is formed between the first and second insulation layers 333 and 334. The metal layer 336 may block visible light, which is incident on the first and second insulation layers 333 and 334 from outside, from being transmitted to the pixel layer 341. The metal layer 336 may include gold (Au), silver (Ag), copper (Cu), or aluminum (Al). As the visible light incident from outside is blocked from being transmitted to the pixel layer 341 by the metal layer 336, optical black pixels (not illustrated) formed in the pixel layer 341 may generate optical black signals having a dark level.

Figure 3B:
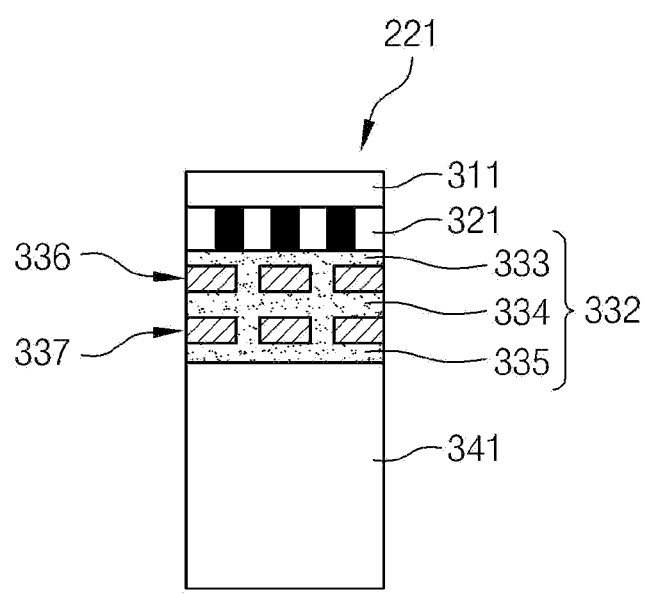

FIG. 3B is a side cross-sectional view of an embodiment of the optical block area 221 illustrated in FIG. 2. Referring to FIG. 3B, the UV pass filter 332 includes a plurality of insulation layers 333 to 335 and a plurality of metal layers 336 and 337. FIG. 3B illustrates only three insulation layers and two metal layers for illustrative purpose. Between the insulation layers 333 to 335, the metal layers 336 and 337 are respectively formed.

As the UV pass filter 332 includes the metal layers 336 and 337, the visible light blocking effect increases. In the present embodiment, three or more metal layers may be provided. At this time, the metal layers 336 and 337 may be arranged at even intervals from each other. Each of the insulation layers 336 and 337 may include an oxide layer, a nitride layer, or a composite layer of oxide and nitride. Each of the metal layers 336 and 337 may include Au, Ag, Cu, or Al.

Figure 4A:
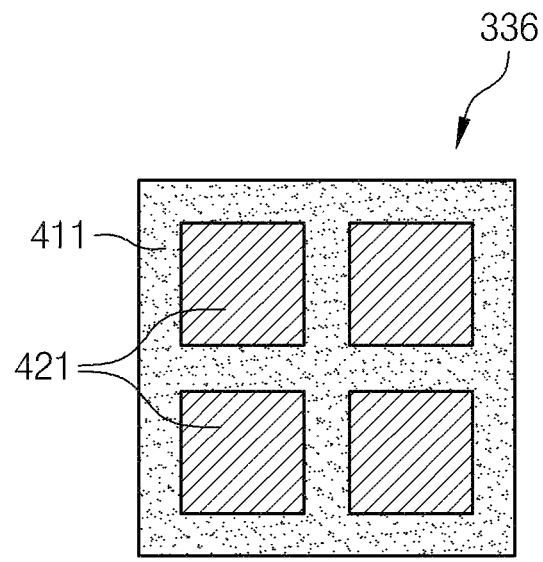
FIG. 4A is a plan view illustrating an embodiment of a metal layer illustrated in FIG. 3A.

FIG. 4A is a plan view of an embodiment of the metal layer 336 illustrated in FIG. 3A. Referring to FIG. 4A, the metal layer 336 includes a plurality of metal chips 421. The metal chips 421 may have a square plate shape and may be arranged in a matrix shape. Through spaces 411 between the metal chips 421, UV light incident on the optical block area 221 of FIG. 2 from outside may reach the pixel layer 341 of FIG. 3A. The horizontal or vertical size of the square metal chips 421 may be set to 80 nm, the space 411 between the metal chips 421 may be set to 30 nm, the thickness of the metal chip 421 may be set to 1,400 Å, and the thickness of the metal layer 336 may be set to 1,500 to 3,500 Å.

Figure 4B:
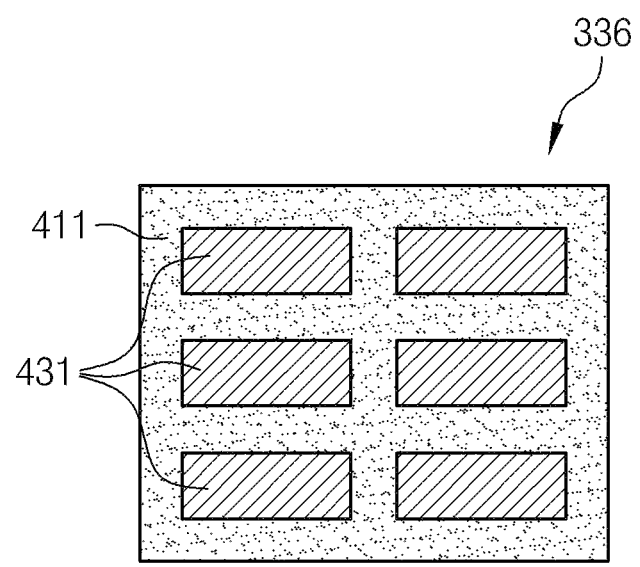
FIG. 4B is a plan view illustrating an embodiment of the metal layer illustrated in FIG. 3A.

FIG. 4B is another plan view of an embodiment of the metal layer 336 illustrated in FIG. 3A. Referring to FIG. 4B, the metal layer 336 includes a plurality of metal chips 431. The metal chips 431 may have a rectangular plate shape, and may be arranged in a matrix shape. Through the spaces 411 between metal chips 431, UV light incident on the optical block area 221 of FIG. 2 from outside may reach the pixel layer 341 of FIG. 3A. The horizontal length of the rectangular metal chips 431 may be set to 80 nm, the space 411 between the metal chips 431 may be set to 30 nm, the thickness of the metal chips 431 may be set to 1,400 Å, and the thickness of the metal layer 336 may be set to 1,500 to 3,500 Å.

Figure 4C:
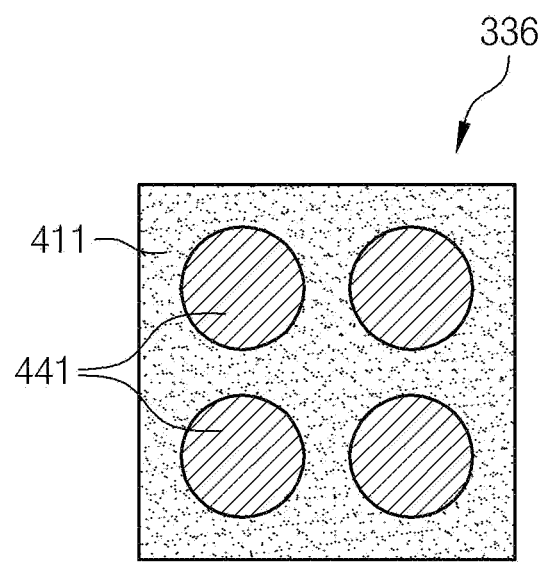
FIG. 4C is a plan view illustrating the embodiment of the metal layer illustrated in FIG. 3A.

FIG. 4C is another plan view of an embodiment of the metal layer 336 illustrated in FIG. 3A. Referring to FIG. 4C, the metal layer 336 includes a plurality of metal chips 441. The metal chips 441 may have a circular plate shape and may be arranged in a matrix shape. Through spaces 411 between the metal chips 441, UV light incident on the optical block area 221 of FIG. 2 from outside may reach the pixel layer 341 of FIG. 3A. The diameter of the circular metal chip 441 may be set to 80 nm, the space 411 between the circular metal chips 441 may be set to 30 nm, the thickness of the metal chip 441 may be set to 1,400 Å, and the thickness of the metal layer 336 may be set to 1,500 to 3,500 Å.

Figure 4D:
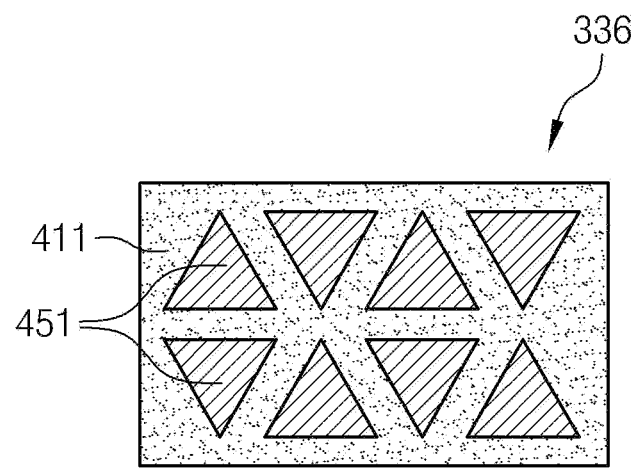
FIG. 4D is a plan view illustrating the embodiment of the metal layer illustrated in FIG. 3A.

FIG. 4D is another plan view of an embodiment of the metal layer 336 illustrated in FIG. 3A. Referring to FIG. 4D, the metal layer 336 includes a plurality of metal chips 451. The metal chips 451 may have a regular-triangle plate shape and may be arranged in a matrix shape. Referring to FIG. 4D, the metal chips 451 may be arranged reversely to each other in a vertical direction. Through spaces 411 between the metal chips 451, UV light incident on the optical block area 221 of FIG. 2 from outside may reach the pixel layer 341 of FIG. 3A. The height of the regular triangle of the metal chip 451 may be set to 80 nm, the space 411 between the metal chips 451 may be set to 30 nm, the thickness of the metal chip 451 may be set to 1,400 Å, and the thickness of the metal layer 336 may be set to 1,500 to 3,500 Å. FIG. 4D illustrates the metal chips that may have a regular-triangle plate shape. However, the shape of the metal chips 451 is not limited to the regular-triangle, and may be set to various other types of triangles, such as an isosceles triangle and a right-angled triangle.

The embodiments of FIGS. 4A to 4D may be applied in the same manner to the metal layers 336 and 337 of FIG. 38.

The metal chips 421, 431, 441, and 451 formed in the metal layer 336 according to the embodiments of the present invention may be formed in various shapes including the shapes of the embodiments of FIGS. 4A to 4D.

Figure 5A:
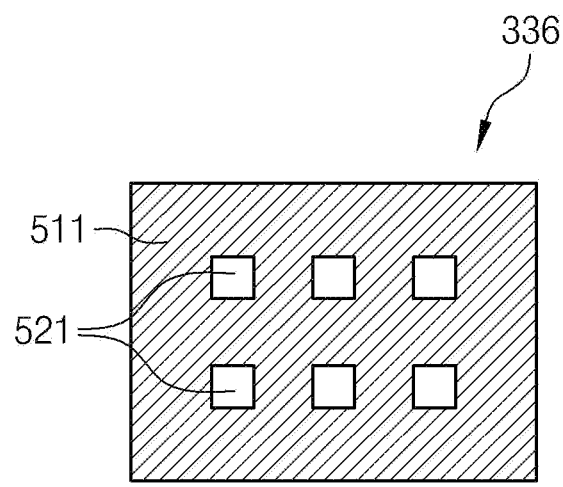
FIG. 5A is a plan view illustrating an embodiment of the metal layer illustrated in FIG. 3A.

FIG. 5A is a plan view of an embodiment of the metal layer 336 illustrated in FIG. 3A. Referring to FIG. 5A, the metal layer 336 may be formed in a net shape. That is, the metal layer 336 may have a metal area 511 and a plurality of square holes 521 arranged in a matrix shape. Through the square holes 521, UV light incident on the optical block area 221 of FIG. 2 from outside may reach the pixel layer 341 of FIG. 3A. The horizontal or vertical length of the square hole 521 may be set to 80 nm, the pitch between the square holes 521 may be set to 30 nm, and the thickness of the metal layer 336 may be set to 1,400 Å.

Figure 5B:
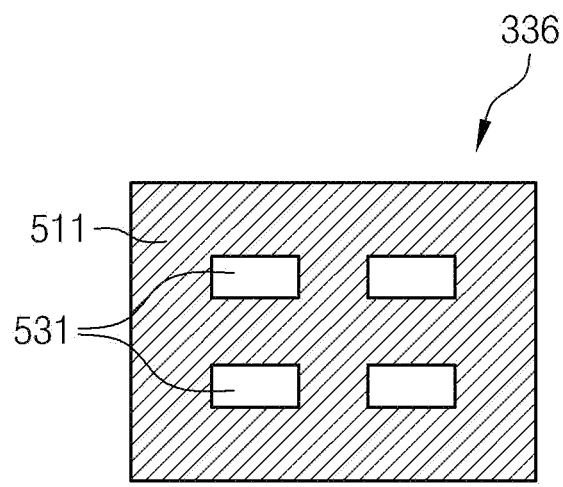
FIG. 5C is another plan view illustrating the embodiment of the metal layer illustrated in FIG. 3A.
FIG. 5D is another plan view illustrating the embodiment of the metal layer illustrated in FIG. 3A.

FIG. 5B is another plan view of an embodiment of the metal layer 336 illustrated in FIG. 3A. Referring to FIG. 5B, the metal layer 336 may be formed in a net shape. That is, the metal layer 336 may have a metal area 511 and a plurality of rectangular holes 531 arranged in a matrix shape. Through the rectangular holes 531, UV light incident on the optical block area 221 of FIG. 2 from outside may reach the pixel layer 341 of FIG. 3A. The horizontal length of the rectangular hole 531 may be set to 80 nm, the pitch between the rectangular holes 531 may be set to 30 nm, and the thickness of the metal layer 336 may be set to 1,400 Å.

Figure 5C:
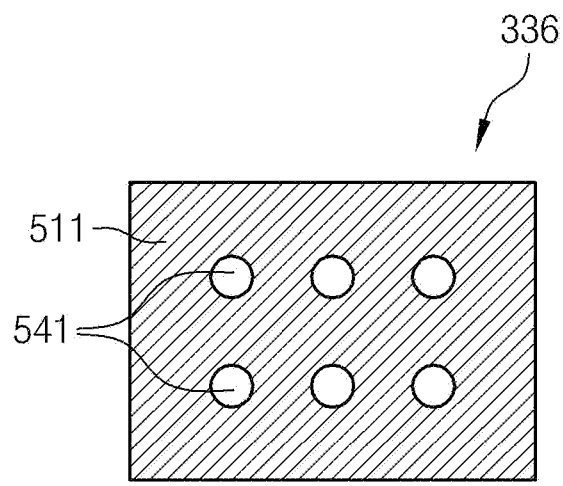

FIG. 5C is another plan view of an embodiment of the metal layer 336 illustrated in FIG. 3A. Referring to FIG. 5C, the metal layer 336 may be formed in a net shape. That is, the metal layer 336 may have a metal area 511 and a plurality of circular holes 541 arranged in a matrix shape. Through the circular holes 541, UV light incident on the optical block area 221 of FIG. 2 from outside may reach the pixel layer 341 of FIG. 3A. The diameter of the circular hole 541 may be set to 80 nm, the pitch between the circular holes 541 may be set to 30 nm, and the thickness of the metal layer 336 may be set to 1,400 Å.

Figure 5D:
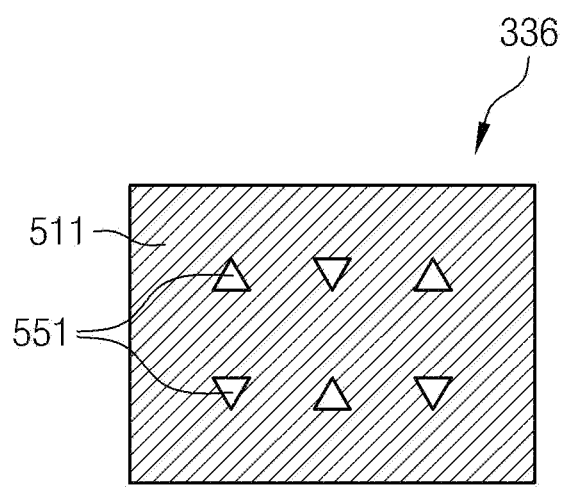

FIG. 5D is another plan view of an embodiment of the metal layer 336 illustrated in FIG. 3A. Referring to FIG. 5D, the metal layer 336 may be formed in a net shape. That is, the metal layer 336 may have a metal area 511 and a plurality of regular-triangle holes 551 arranged in a matrix shape. As illustrated in FIG. 5D, the regular-triangle holes 551 may be arranged reversely to each other in a vertical direction. Through the regular-triangle holes 531, UV light incident on the optical block area 221 of FIG. 2 from outside may reach the pixel layer 341 of FIG. 3A. The height of the regular triangle of the hole 551 may be set to 80 nm, the pitch between the regular-triangle holes 551 may be set to 30 nm, and the thickness of the metal layer 336 may be set to 1,400 Å. FIG. 5D illustrates the regular-triangle holes 551. However, the holes 551 are not limited to the regular-triangle, but may be formed in various triangle shapes including an isosceles triangle and a right-angled triangle.

The embodiments of FIGS. 5A to 5D may be applied in the same manner to the metal layers 336 and 337 illustrated in FIG. 253B.

The holes 521, 531, 541, and 551 formed in the metal layer 336 according to the embodiments of the present invention may be applied to various shapes including the embodiments illustrated in FIGS. 5A to 5D.

Figure 6:
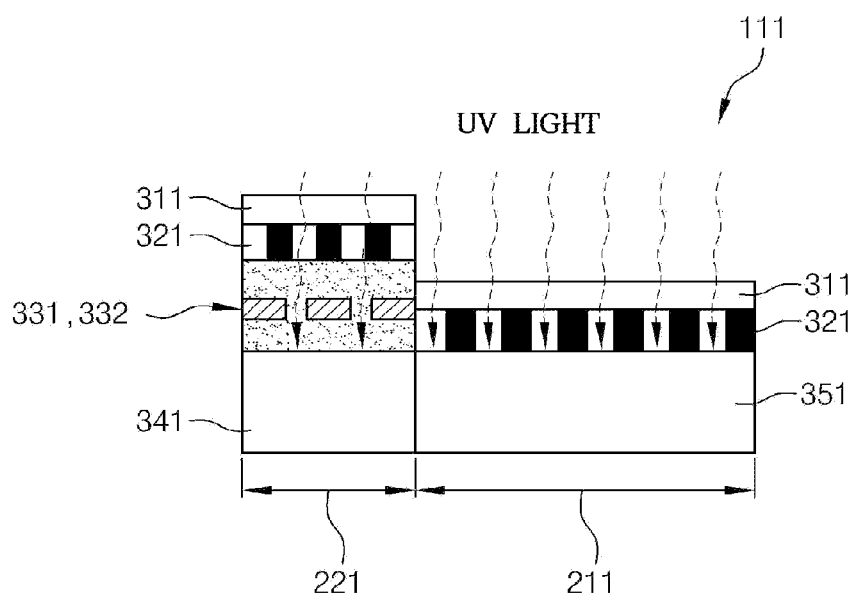
FIG. 6 illustrates a state in which UV light is applied to the pixel array illustrated in FIG. 2.

FIG. 6 illustrates a state in which UV light is applied to the pixel array 111. Referring to FIG. 6, when UV light is applied to the pixel array 111, the UV light reaches the pixel layer 351 through the micro-lens 311 and the color filter 321, which are formed in the active pixel area 211. Similarly, the UV light reaches the pixel layer 341 through the micro-lens 311, the color filter 321, and the UV pass filters 331 and 332, which are formed in the optical block area 221.

As the UV pass filters 331 and 332 are provided in the optical block area 221 according to the embodiments of the present invention, UV light applied to the optical block area 221 from outside may reach the pixel layer 341 formed in the optical block area 221 through the UV pass filters 331 and 332.

Specifically, in order to prevent plasma damage, which occurs after a back-end process, or particularly, after an etching process, a curing process using UV light may be performed. For example, when UV light having a low energy of 4.3 to 8.8 eV may be irradiated onto the pixel array 111 for tens of seconds, an anneal effect may occur through injection of photo-electrons generated from silicon. Furthermore, ions caused by plasma are erased or detrapped in a state where they are trapped in an interface state.

During the curing process using UV light, the optical black pixels formed in the optical block area 221 have the same curing effect as the main pixels formed in the active pixel area 211. Thus, since the pixels in the optical block area 221 have the same dark current characteristic as the pixels in the active pixel area 211, a serious asymmetry between the pixels disappears. As a result, the image noise characteristic may be improved. That is, the degradation of the image noise characteristic may be prevented.

Figure 7:
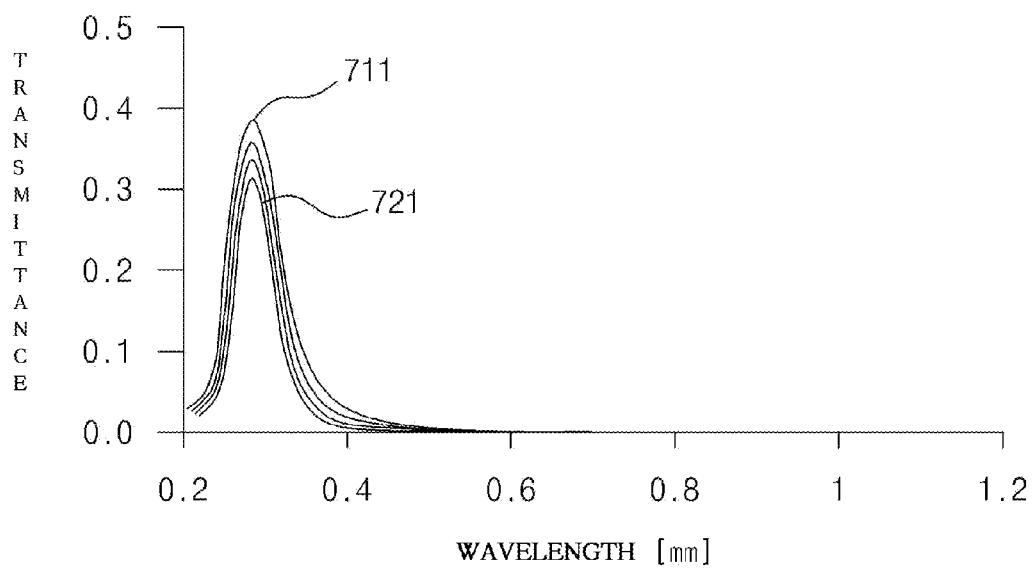
FIG. 7 is a graph illustrating the relationship between the transmittance of UV light and the size of metal layers of FIGS. 4A to 4D.

FIG. 7 is a graph illustrating the relationship between the transmittance of UV light and the size of the metal layers 421 to 451 of FIGS. 4A to 4D. Referring to FIG. 7, it may be seen that the transmittance increases with the decrease in the size of the metal layers 421 to 451. That is, when the metal layers 421 to 451 have a small size (711), the transmittance is higher than when the metal layers 421 to 451 have a large size (721).

The embodiments of present invention may be applied to a process of fabricating a device, which performs a curing process using UV light, for example, a flash memory semiconductor device.

According to the embodiments of the present invention, the CMOS image sensor includes the UV pass filter formed in the optical block area. That is, the optical block area blocks visible light and passes UV light.

As the optical block area is formed to pass UV light, UV light incident on the optical block area is irradiated onto the pixels formed in the optical block area through the optical block area, when the UV curing process is performed on the CMOS image sensor. That is, the pixels formed in the optical block area may have the same curing effect as the pixels formed in the active pixel area through the UV curing process.

Thus, as the pixels in the optical block area have the same dark current characteristic as the pixels in the active pixel area, a serous asymmetry between the pixels disappears. As a result, the image noise characteristic of the CMOS image sensor may be improved.

Although a various embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A CMOS image sensor comprising:
    an active pixel structure suitable for sensing light incident from outside and converting a sensed light into an electrical signal; and
    an optical block structure suitable for blocking a visible light and passing a UV light to check and evaluate an electrical characteristic of the active pixel area,
    wherein the optical block structure comprises a UV pass filter comprising:
        first and second insulation layers comprising an insulator, and
        a metal layer formed between the first and second insulation layers.

2. The CMOS image sensor of claim 1, wherein the metal layer comprises a plurality of metal chips and spaces surrounding each metal chip.

3. The CMOS image sensor of claim 2, wherein the metal chips have a width larger than the space.

4. The CMOS image sensor of claim 2, wherein the metal chips have the same shape.

5. The CMOS image sensor of claim 2, wherein the metal chips are arranged in a direction substantially parallel to the first and second insulation layers.

6. The CMOS image sensor of claim 1, wherein the metal layer is formed by a metal including a plurality of holes inside the metal.

7. The CMOS image sensor of claim 6, wherein the holes have a diameter larger than a space between the respective holes.

8. The CMOS image sensor of claim 6, wherein the holes have the same shape.

9. A CMOS image sensor comprising:
    an active pixel structure suitable for sensing light incident from outside and converting a sensed light into an electrical signal; and
    an optical block structure suitable for blocking a visible light and passing a UV light to check and evaluate an electrical characteristic of the active pixel area,
    wherein the optical block structure comprises a UV pass filter comprising:
        a plurality of insulation layers comprising an insulator, respectively, and
        a plurality of metal layers formed between the first and second insulation layers, respectively.

10. The CMOS image sensor of claim 9, wherein each metal layer comprises a plurality of metal chips and spaces surrounding each metal chip.

11. The CMOS image sensor of claim 10, wherein the metal chips have a width larger than the space.

12. The CMOS image sensor of claim 10, wherein the metal chips have the same shape.

13. The CMOS image sensor of claim 10, wherein the metal chips are arranged substantially in a direction parallel to the insulation layers.

14. The CMOS image sensor of claim 9, wherein each metal layer is formed by a metal including a plurality of holes inside the metal.

15. The CMOS image sensor of claim 14, wherein the holes formed in each of the metal layers have a diameter larger than the space between the holes.

16. The CMOS image sensor of claim 14, wherein the holes have the same shape.

* * * * *